United States Patent [19]
Hibino

[11] Patent Number: 5,657,274
[45] Date of Patent: Aug. 12, 1997

[54] SEMICONDUCTOR MEMORY DEVICE ADAPTED TO A HIGH-SPEED OPERATION, A LOW SUPPLY VOLTAGE, AND THE USE OF A MULTILEVEL CELL WITH A PLURALITY OF THRESHOLD VALUES AS A MEMORY CELL TRANSISTOR

[75] Inventor: Kenji Hibino, Tokyo, Japan

[73] Assignee: NEC Corporation, Tokyo, Japan

[21] Appl. No.: 703,910

[22] Filed: Aug. 27, 1996

[30] Foreign Application Priority Data

Aug. 28, 1995 [JP] Japan ................................ 7-218705

[51] Int. Cl.$^6$ ................................................ G11C 13/00
[52] U.S. Cl. ................. 365/189.01; 365/51; 365/189.04; 365/230.04
[58] Field of Search ............................. 365/189.01, 182, 365/189.02, 189.04, 230.03, 51, 230.04

[56] References Cited

U.S. PATENT DOCUMENTS 5,499,216  3/1996  Yamamoto ..................... 365/230.04

FOREIGN PATENT DOCUMENTS 6-104406  4/1994  Japan .

*Primary Examiner*—Terrell W. Fears
*Attorney, Agent, or Firm*—Foley & Lardner

[57] ABSTRACT

In a NOR-type mask ROM, only one of opposite ends of each subsidiary digit line is connected to each block selection MOS transistor. The block selection MOS transistors are alternately connected to one end and the other end of adjacent subsidiary digit lines. Each of the block selection MOS transistors has a source and a drain connected to the primary and the subsidiary digit lines so that a current path at a channel portion has a direction perpendicular to the block selection lines. A gate of each block selection MOS transistor is located directly under the block selection line and has a gate width wider than the width of the subsidiary digit line.

8 Claims, 6 Drawing Sheets

SEMICONDUCTOR MEMORY DEVICE ADAPTED TO A HIGH-SPEED OPERATION, A LOW SUPPLY VOLTAGE, AND THE USE OF A MULTILEVEL CELL WITH A PLURALITY OF THRESHOLD VALUES AS A MEMORY CELL TRANSISTOR

BACKGROUND OF THE INVENTION

This invention relates to a semiconductor memory device and, in particular, to a semiconductor memory device for use as a NOR-type mask ROM (Read Only Memory).

Recently, use has been made of a NOR-type mask ROM as a large-capacity semiconductor memory device. The NOR-type mask ROM comprises a plurality of MOS transistors. Each of the MOS transistors has a gate connected to each of word lines arranged in parallel to one another, and a source and a drain formed by $N^+$ diffusion layers intersecting with the word lines. The MOS transistors are arranged in columns and rows to form an array which will be referred to as a memory cell array. Likewise, the MOS transistors may be referred to as memory cell transistors or simply as memory cells.

Specifically, a conventional semiconductor memory device of the type described comprises, a plurality of primary digit lines and a plurality of subsidiary digit lines, as will later be described in detail. Each of the subsidiary digit lines is formed by an $N^+$ diffusion layer. Each of the primary digit lines is arranged between each odd-numbered subsidiary digit line and each even-numbered subsidiary digit line next thereto. Between every two adjacent ones of the subsidiary digit lines, a plurality of memory cells comprising MOS transistors are connected with each subsidiary digit line used as a source or a drain. Thus, the memory cells are arranged in columns and rows to form a memory cell array. A gate of each memory cell is connected to each of word lines arranged in parallel to one another. A plurality of block selection MOS transistors are connected to one ends of the odd-numbered subsidiary digit lines at one side of the memory cells, respectively. Each pair of two adjacent ones of the block selection MOS transistors are also connected to each odd-numbered primary digit line interposed therebetween. Gates of the block selection MOS transistors are alternately connected to one and the other of two block selection lines. In each of the block selection MOS transistors, a current path at a channel portion is taken in a direction intersecting with each of the subsidiary digit lines. Likewise, a plurality of block selection MOS transistors are connected to one ends of the even-numbered subsidiary digit lines at one side of the memory cells, respectively. Each pair of two adjacent ones of the block selection MOS transistors are also connected to each even-numbered primary digit line interposed therebetween. Gates of the block selection MOS transistors are alternately connected to one and the other of the above-mentioned two block selection lines. Similarly, in each of the block selection MOS transistors, a current path at a channel portion is taken in a direction intersecting with each of the subsidiary digit lines.

In the above-mentioned circuit structure of the conventional semiconductor memory device, however, each block selection MOS transistor is connected in series to the memory cells. This means that the discharge current for reading information greatly depends on the driving current of the block selection MOS transistor. Accordingly, in order to achieve a high-speed reading operation, it is required to increase the width of the block selection line which defines an area of a part where the channel width of each bank selection MOS transistor is determined. As a result, a chip size is inevitably increased.

In view of the above-mentioned disadvantage in the conventional semiconductor memory device, an improved semiconductor memory device is proposed in Japanese Unexamined Patent Publication No. 104406/1994. As will later be described in detail, the semiconductor memory device disclosed in the above-referenced publication tries to widen the channel width of the block selection MOS transistor without changing the chip area.

In the meanwhile, a recent trend in the mask ROM is to increase an operation speed and, on the other hand, to reduce a supply voltage without decreasing an operation speed currently achieved. In accordance with such trend, the block selection MOS transistor must have a greater current drivability. In addition, in order to meet the use of so-called multilevel cells in which a plurality of threshold values are set in each memory cell transistor, it is required to perform a reading operation from a memory cell transistor having a high threshold value. Also in view of this requirement, the block selection MOS transistor must have a greater current drivability.

In the semiconductor memory device described in the above-referenced publication, the channel width of the block selection MOS transistor can be increased twice at maximum as compared with the conventional semiconductor memory device described earlier in this specification. In order to further increase the current drivability, the width of the block selection line must be widened. This results in an increase of the chip size. In addition, since an increased area of the $N^+$ diffusion layer is connected to the primary digit line through a contact portion, the capacity applied to the primary digit line is increased. This makes it difficult to achieve a high-speed reading operation.

SUMMARY OF THE INVENTION

It is therefore a general object of this invention to provide a semiconductor memory device which is adapted to a high-speed operation, a low supply voltage, and the use of a multilevel cell with a plurality of threshold values as a memory cell transistor.

It is a specific object of this invention to provide a semiconductor memory device of the type with a block selection MOS transistor having a greater current drivability as compared with a conventional device, while suppressing an increase in chip area and digit line capacity.

It is a further specific object of this invention to provide a semiconductor memory device of the type which is capable of effectively utilizing a part of a block selection line as a transistor gate by changing a current path of a block selection MOS transistor.

Other objects of this invention will become clear as the description proceeds.

A semiconductor memory device according to this invention comprises a plurality of units each of which includes a plurality of word lines arranged in parallel to one another on a semiconductor substrate; first and second block selection lines formed in parallel to the word lines at one side of the word lines; third and fourth block selection lines formed in parallel to the word lines at the other side of the word lines; first and second primary digit lines comprising metal conductors perpendicular to the word lines; first through fourth subsidiary digit lines comprising $N^+$ diffusion layers perpendicular to the word lines; a plurality of memory cells with their drains and sources connected to adjacent ones of intersecting positions between the word lines and the first through the fourth subsidiary digit lines and with their gates connected to the word lines; a first block selection MOS transistor with its source and drain connected to the first primary digit line and the first subsidiary digit line so that a current path at a channel portion has a direction perpendicular to the first block selection line and with its gate located directly under the first block selection line and connected to the first block selection line; a second block selection MOS transistor with its source and drain connected to the first primary digit line and the third subsidiary digit line so that a current path at a channel portion has a direction perpendicular to the second block selection line and with its gate located directly under the second block selection line and connected to the second block selection line; a third block selection MOS transistor with its source and drain connected to the second primary digit line and the second subsidiary digit line so that a current path at a channel portion has a direction perpendicular to the third block selection line and with its gate located directly under the third block selection line and connected to the third block selection line; and a fourth block selection MOS transistor with its source and drain connected to the second primary digit line and the fourth subsidiary digit line so that a current path at a channel portion has a direction perpendicular to the fourth block selection line and with its gate located directly under the fourth block selection line and connected to the fourth block selection line; the gate width of the first through the fourth block selection MOS transistors being greater than the length of the first through the fourth subsidiary digit lines in the direction of the word lines.

Preferably, in at least one of a combination of the first and the second block selection MOS transistors and a combination of the third and the fourth selection MOS transistors, the diffusion layers connected to the primary digit lines are linked in a stepwise fashion.

Preferably, each of the memory cell comprises a transistor which is given any one of four threshold values.

DESCRIPTION OF THE PREFERRED EMBODIMENTS

In order to facilitate an understanding of this invention, a conventional semiconductor memory device will at first be described with reference to FIGS. 1 and 2.

Figure 1:
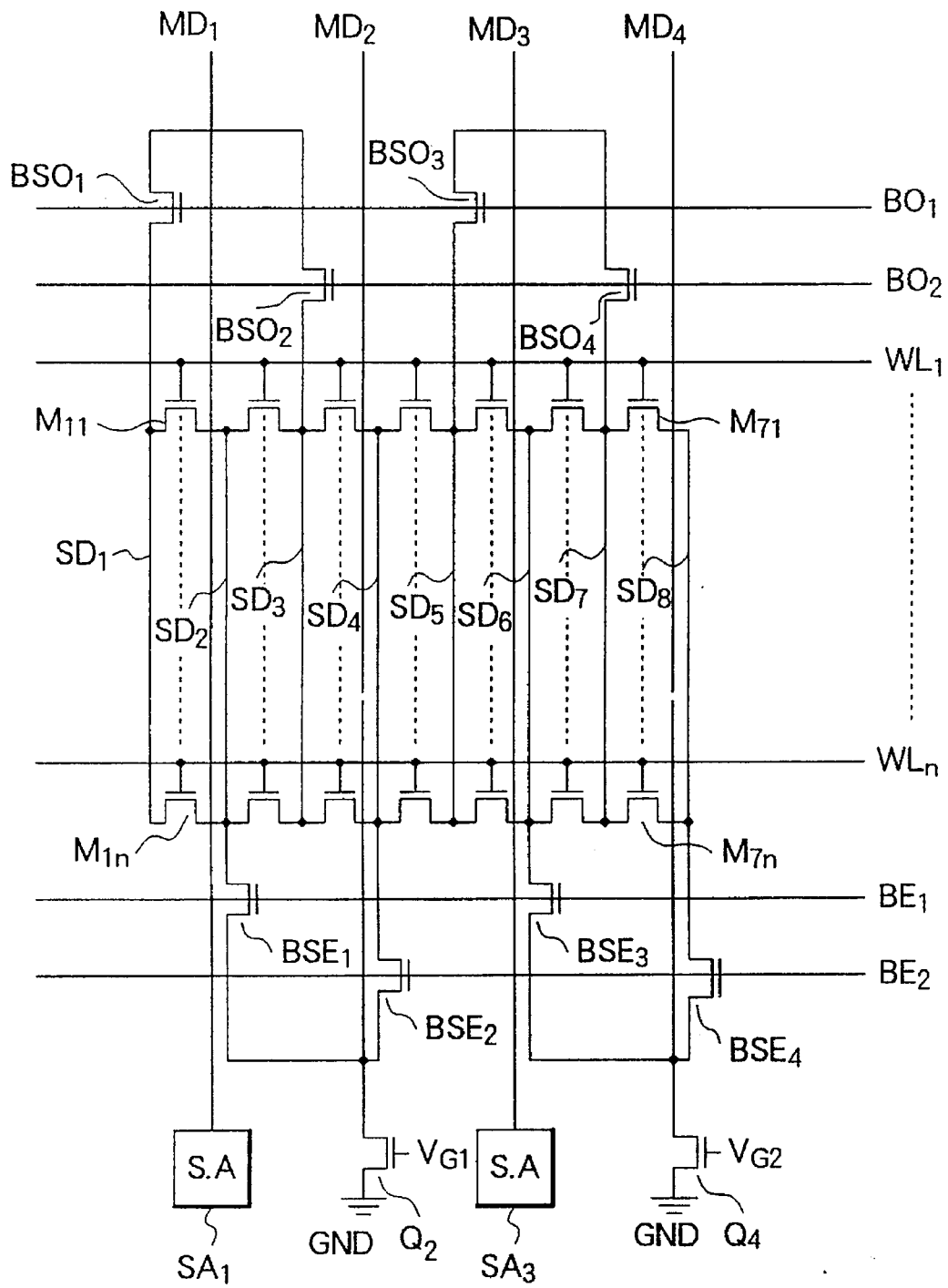
FIG. 1 is a circuit diagram of a conventional NOR-type mask ROM.
Figure 2:
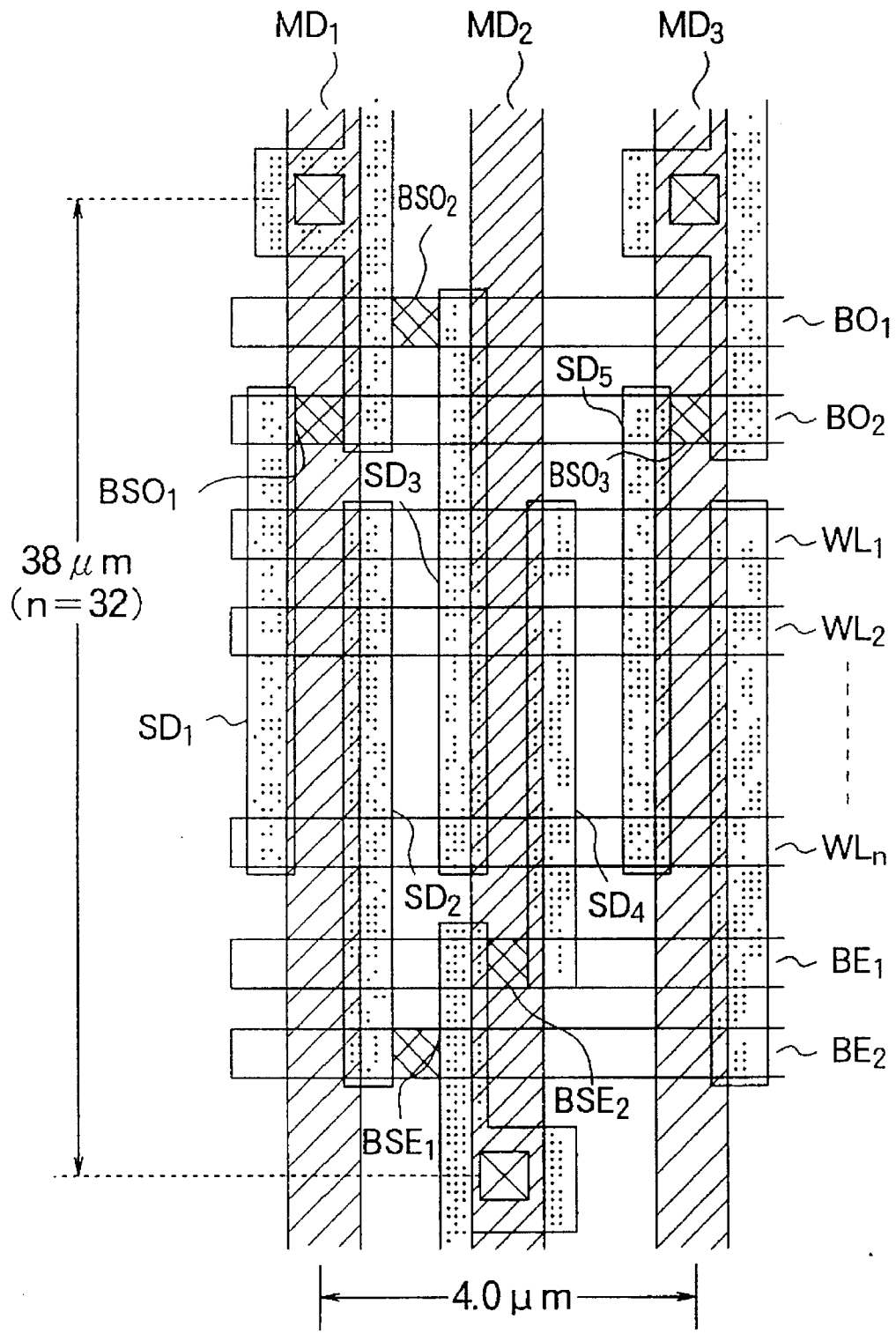
FIG. 2 shows a layout on the surface of a semiconductor substrate of the conventional NOR-type mask ROM.

FIGS. 1 and 2 show a circuit diagram and a typical layout of a memory cell array of a mask ROM, respectively.

Referring to FIGS. 1 and 2, each primary digit line (for example, $MD_1$) is arranged between each odd-numbered one and each even-numbered and next one (for example, $SD_1$ and $SD_2$) of subsidiary digit lines comprising $N^+$ diffusion layers. Between every two adjacent subsidiary digit lines, a plurality of memory cells comprising MOS transistors are connected with each subsidiary digit line used as a source or a drain. Gates of the memory cells in each column are connected to word lines $WL_1$ through $WL_n$, respectively. Each of the primary digit lines $MD_1$, $MD_2$, ... is connected either to a sense amplifier SA or to the ground GND. Between the ground GND and the primary digit lines connected thereto, transistors $Q_2$, $Q_4$, ... are interposed. Block selection MOS transistors $BSO_1$, $BSO_2$, ... are connected to one ends of the odd-numbered subsidiary digit lines $SD_{2m-1}$ (m being a positive integer) at one side of the memory cells (upper side in FIGS. 1 and 2), respectively. Each pair of two adjacent ones of the block selection MOS transistors (for example, $BSO_1$ and $BSO_2$) are also connected to each odd-numbered primary digit line (for example, $MD_1$) interposed therebetween. Gates of the block selection MOS transistors are alternately connected to one and the other of two block selection lines $BO_1$ and $BO_2$. In each of the block selection MOS transistors, a current path at a channel portion is taken in a direction intersecting with each subsidiary digit line $SD_{2m-1}$.

Likewise, block selection MOS transistors $BSE_1$, $BSE_2$, ... are connected to one ends of the even-numbered subsidiary digit lines $SD_{2m}$ (m being a positive integer) at one side of the memory cells, respectively. Each pair of two adjacent ones of the block selection MOS transistors (for example, $BSE_1$ and $BSE_2$) are also connected to each even-numbered primary digit line (for example, $MD_2$) interposed therebetween. Gates of the block selection MOS transistors are alternately connected to one and the other of the two block selection lines $BE_1$ and $BE_2$. In each of the block selection MOS transistors, a current path at a channel portion is taken in a direction intersecting with each subsidiary digit line $SD_{2m}$.

However, with the above-mentioned circuit structure, each block selection MOS transistor is connected in series to the memory cells comprising the MOS transistors. This means that the discharge current for reading information greatly depends on the driving current of the block selection MOS transistor. Accordingly, in order to achieve a high-speed reading operation, it is required to increase an area of a part where the channel width of each block selection MOS transistor is formed, in other words, to increase the width of the block selection line. As a result, a chip size is inevitably increased.

Next referring to FIGS. 3 and 4, description will be made as regards another conventional example disclosed in the above-referenced publication. The similar functional parts are designated by like reference numerals as those described in conjunction with FIGS. 1 and 2.

Figure 3:
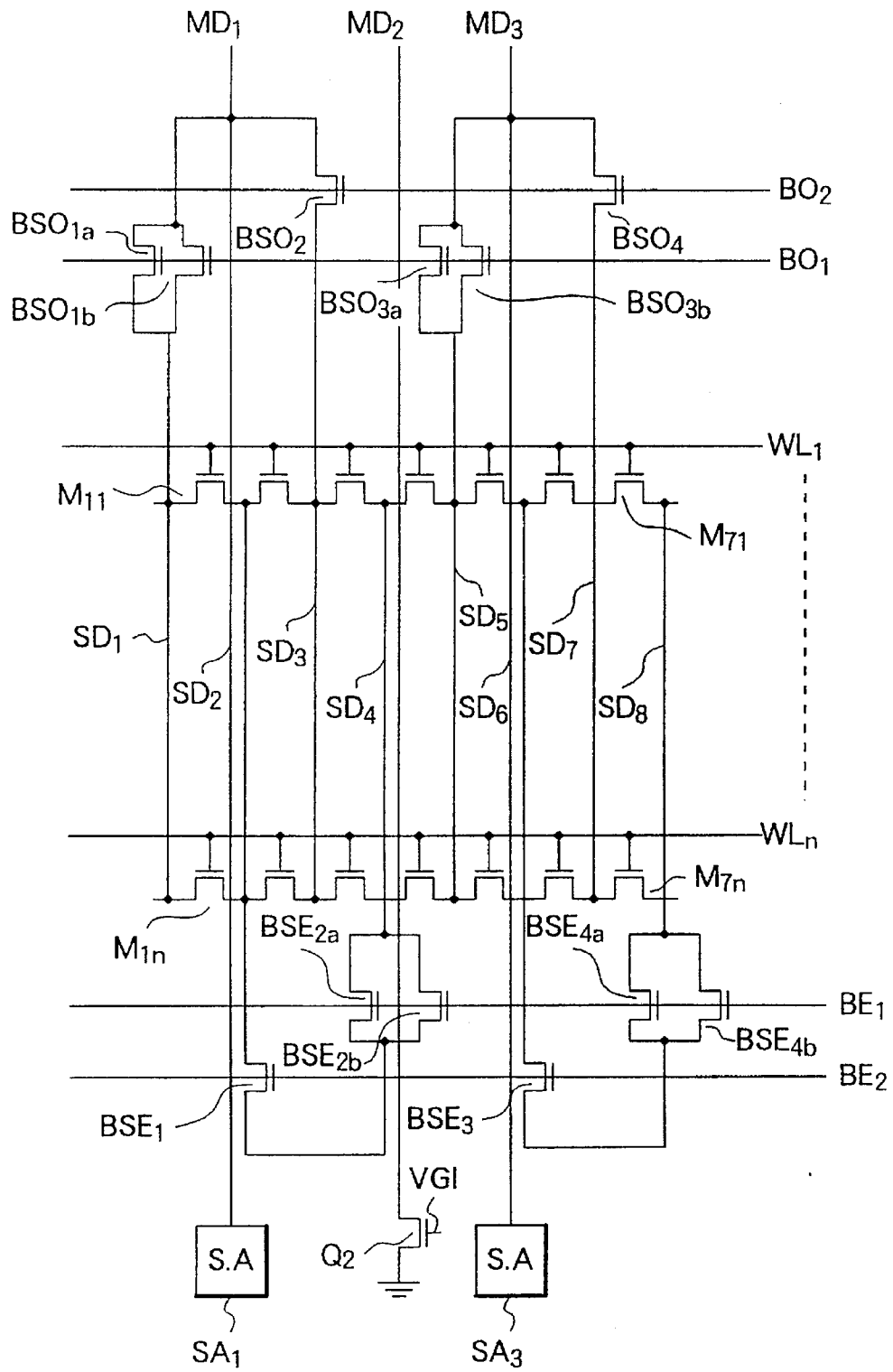
FIG. 3 is a circuit diagram of another conventional NOR-type ROM.

Referring to FIG. 3, two block selection MOS transistors (for example, $BSO_{1a}$, $BSO_{1b}$) are connected in parallel to each other and in common to one end of an odd-numbered or (4m-3)-th (m being a positive integer) subsidiary digit line (for example, $SD_1$) at one side of memory cells (upper side in FIG. 3). Gates of these block selection MOS transistors are connected in common to a block selection line $BO_1$. On the other hand, one block selection MOS transistor (for example, $BSO_2$) is connected to one end of a next odd-numbered or (4m-1)-th (m being a positive integer) subsidiary digit line (for example, $SD_3$) at one side of the memory cell (upper side in FIG. 3). A gate of this block selection MOS transistor is connected to another block selection line $BO_2$. The above-described three block selection MOS transistors (for example, $BSO_{1a}$, $BSO_{1b}$, and $BSO_2$) adjacent to one another are also connected to an odd-numbered primary digit line (for example, $MD_1$) interposed therebetween.

One block selection MOS transistor (for example, $BSE_1$) is connected to one end of an even-numbered or (4m-2)-th (m being a positive integer) subsidiary digit line (for example, $SD_2$) at one side of the memory cells (lower side in FIG. 3). A gate of the block selection MOS transistor is connected to a block selection line $BE_1$. On the other hand, two block selection MOS transistors (for example, $BSE_{2a}$ and $BSE_{2b}$) are connected in parallel to each other and in common to the one end of a next even-numbered or 4m-th (m being a positive integer) subsidiary digit line (for example, $SD_4$) at one side of the memory cells (lower side in FIG. 3). Gates of these block selection MOS transistors are connected to another block selection line $BE_2$. The above-mentioned three block selection MOS transistors (for example, $BSE_{1a}$, $BSE_{2a}$, and $BSE_{2b}$) adjacent to one another are also connected to an even-numbered primary digit line (for example, $MD_2$) interposed therebetween.

Figure 4:
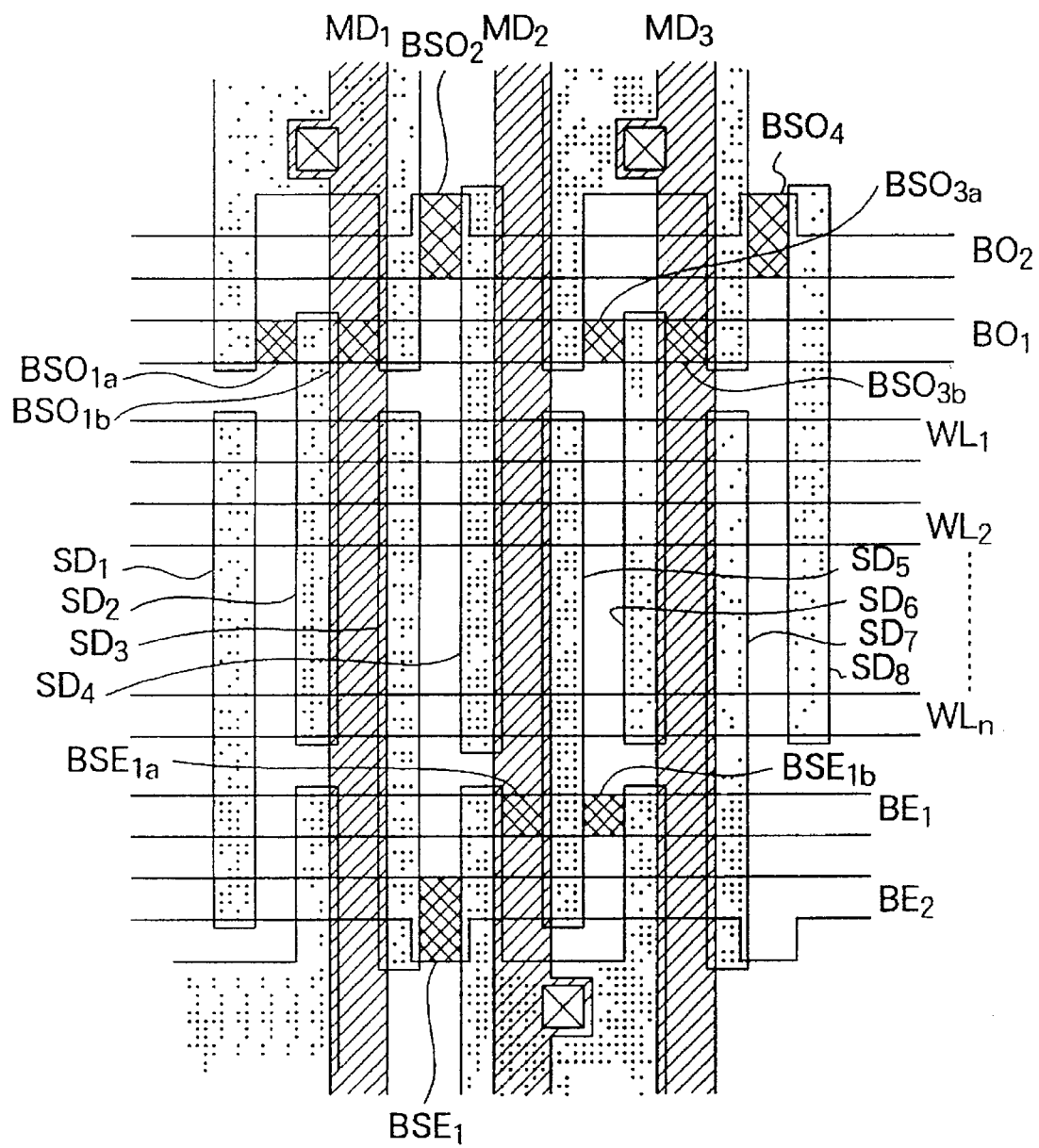
FIG. 4 shows a layout on the surface of a semiconductor substrate of the NOR-type mask ROM illustrated in FIG. 3.

FIG. 4 shows a layout on the surface of a semiconductor substrate disclosed in the above-referenced publication in case where the circuit in FIG. 3 is realized. In the figure, the width of the block selection lines $BO_1$ and $BE_1$ is narrowed while the width of the other block selection lines $BO_2$ and $BE_2$ is partially widened at portions to serve as the gates. The interval of the block selection lines is unchanged.

The block selection MOS transistors to be connected to the block selection lines $BO_1$ and $BE_1$, narrow in width, are formed in parallel to each other in corresponding regions on the block selection lines. With this structure, it is possible to increase a current drivability of the block selection MOS transistor without changing or increasing an area.

In each of the block selection MOS transistors, a current path at a channel portion is arranged directly under the block selection line in a direction intersecting with the subsidiary digit line.

As described above, it is required in the recent mask ROM to increase the current drivability of the block selection MOS transistor. According to the circuit structure proposed in the above-referenced publication, the channel width of the block selection MOS transistor can be increased to twice at maximum as compared with the conventional device illustrated in FIGS. 1 and 2. In order to further increase the current drivability, the width of the block selection line must be widened. This results in an increase of the chip size. In addition, since an increased area of the $N^+$ diffusion layer is connected to the primary digit line through the contact portion, the capacity applied to the primary digit line is increased. This makes it difficult to achieve a high-speed reading operation.

Now, description will proceed to a semiconductor memory device according to a first embodiment of this invention.

Figure 5:
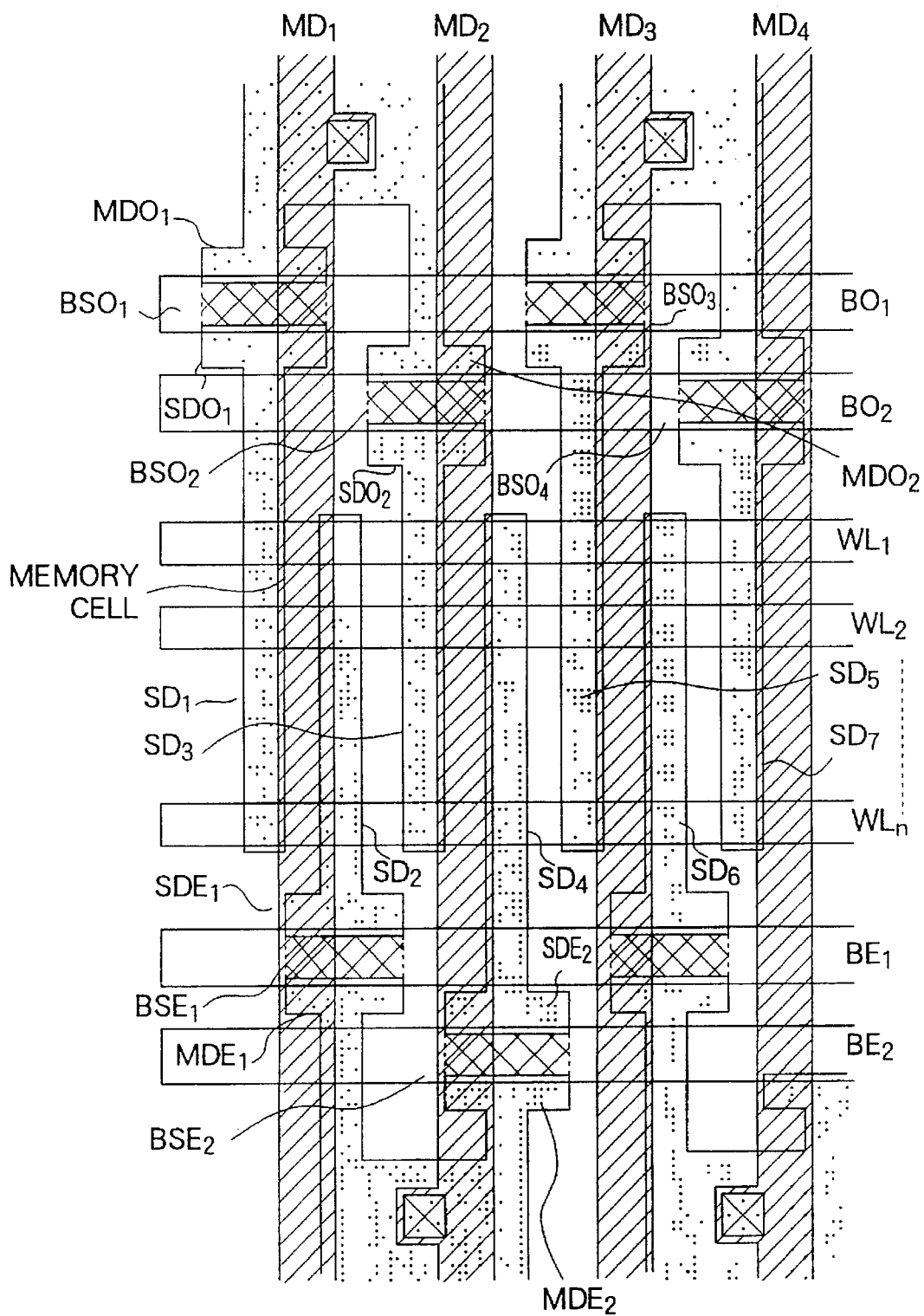
FIG. 5 shows a layout on the surface of a semiconductor substrate according to one embodiment of this invention.

FIG. 5 shows a layout on the surface of a semiconductor substrate of an ROM according to a first embodiment of this invention. The circuit structure is similar to FIG. 1 and will not be described any longer. The similar functional parts are designated by like reference numerals as those described in conjunction with FIG. 2. In the layout according to this embodiment, a single unit comprises two primary digit lines (for example, $MD_1$ and $MD_2$) and four subsidiary digit lines (for example, $SD_1$, $SD_2$, $SD_3$, and $SD_4$) comprising $N^+$ diffusion layers. In practice, a memory cell area comprises a plurality of similar units. Between two adjacent ones of the subsidiary digit lines, a plurality of memory cells comprising MOS transistors are connected. Each memory cell has a source and a drain formed by a part of each subsidiary digit line. Gates of the memory cells in each column are connected to word lines $WL_1$ to $WL_n$, respectively. In this embodiment, a multilevel cell having a plurality of threshold values is used as each memory cell. However, an ordinary memory cell can be used. Each of the primary digit lines (for example, $MD_1$ and $MD_2$) in each unit is connected either to a sense amplifier (for example, $SA_1$) or to the ground GND through a transistor (for example, $Q_2$), in the manner similar to the conventional device illustrated in FIG. 1.

Description will hereafter proceed to a particular unit including the two primary digit lines $MD_1$ and $MD_2$, the four subsidiary digit lines $SD_1$ through $SD_4$, and four memory cell rows $M_{1n}$ through $M_{4n}$ (see FIG. 1). Block selection MOS transistors $BSO_1$ and $BSO_2$ are connected to one ends of the subsidiary digit lines $SD_1$ and $SD_3$ at one side of the memory cells $M_{11}$ and $M_{31}$ (upper side in FIG. 5), respectively. A gate of each of the block selection MOS transistors is arranged directly under either one of block selection lines $BO_1$ and $BO_2$. A source and a drain of each block selection MOS transistor are connected to the primary digit line and the subsidiary digit line so that a current path at a channel portion has a direction intersecting with the block selection lines. The width of the channel portion is widened by making the $N^+$ diffusion layers $MDO_1$, $MDO_2$, $SDO_1$, and $SDO_2$, which serve as the sources and the drains of the block selection MOS transistors, have a length longer than that of the diffusion layers of the subsidiary digit lines $SD_1$ and $SD_3$ in the direction of the word lines (transversal direction in FIG. 5).

Likewise, block selection MOS transistors $BSE_1$ and $BSE_2$ are connected to one ends of the subsidiary digit lines $SD_2$ and $SD_4$ at one side of the memory cells $M_{2n}$ and $M_{4n}$ (lower side in FIG. 5), respectively. A gate of each of the block selection MOS transistors is arranged directly under either one of block selection lines $BE_1$ and $BE_2$. A source and a drain of each block selection MOS transistor are connected to the primary digit line and the subsidiary digit line so that a current path at a channel portion has a direction intersecting with the block selection lines. The width of the channel portion is widened by making then $N^+$ diffusion layers $MDE_1$, $MDE_2$, $SDE_1$, and $SDE_2$, which serve as the sources and the drains of the block selection MOS transistors, have a length longer than that of the diffusion layers of the subsidiary lines $SD_2$ and $SD_4$ in the direction of the word lines (transversal direction in FIG. 5).

With the above-mentioned layout, it is possible to implement a block selection transistor having a wider channel width and a greater current drivability while an increase in chip area and capacity is suppressed.

Figure 6:
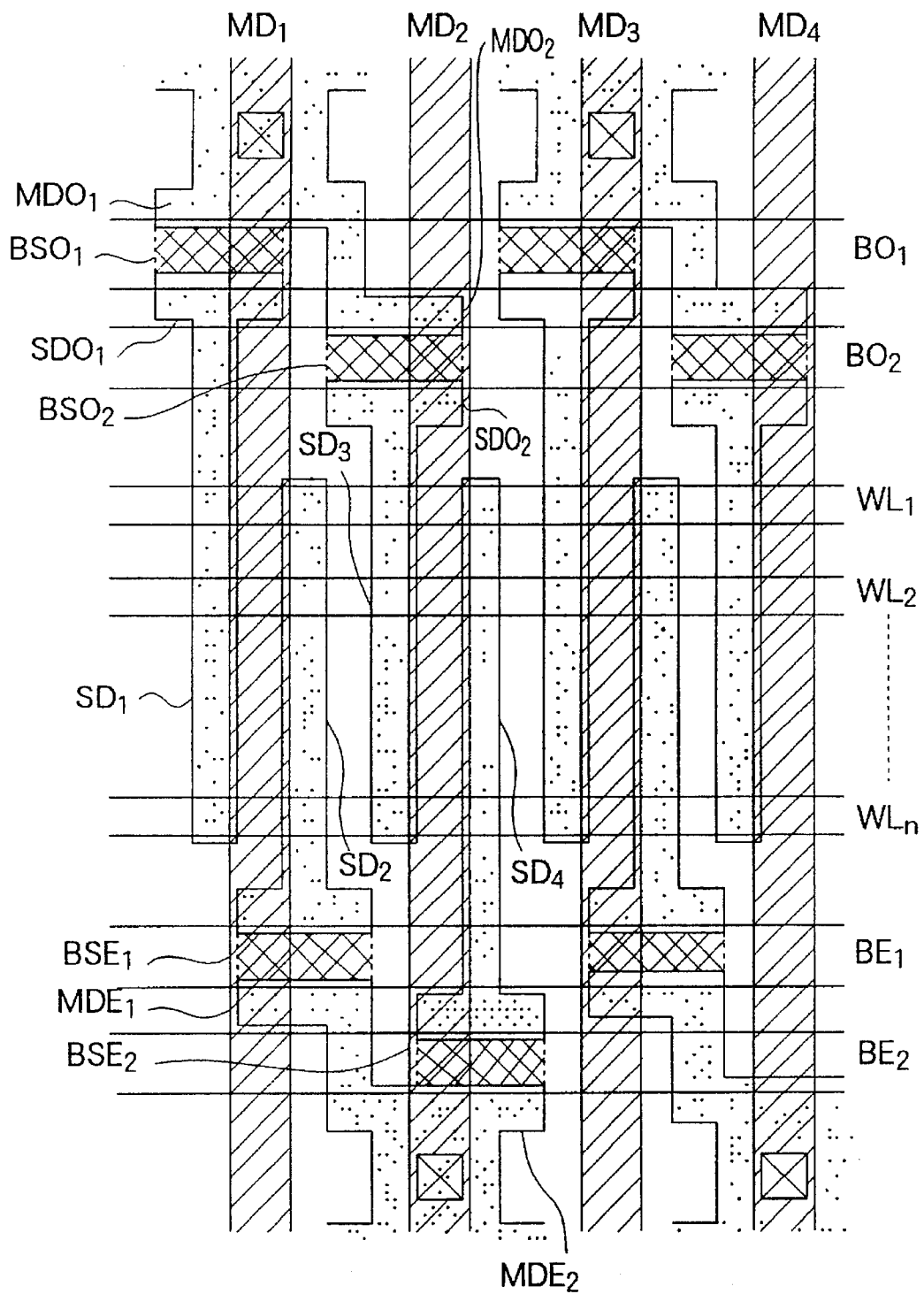
FIG. 6 shows a layout on the surface of a semiconductor substrate according to another embodiment of this invention.

FIG. 6 shows a second embodiment of this invention. By linking the $N^+$ diffusion layers $MDO_1$ and $MDO_2$ of the block selection MOS transistors in a stepwise fashion at the side to be connected to the primary digit lines, the capacity applied to the primary digit line can be suppressed further.

Hereinafter, the effect of this invention will be described as compared with the conventional device in FIG. 2 and another conventional device in FIG. 4 described in the above-mentioned publication. The latter device will be mentioned as the publication device for the time being.

|  | W/L OF BLOCK SELECTION MOS TRANSISTOR | INCREASE IN SIZE (μm) | CAPACITY OF N+ DIFFUSION LAYER |
|---|---|---|---|
| 1ST PRIOR ART (FIG. 2) | 0.5/0.5 | — | 1.0 |
| PUBLICATION DEVICE (FIG. 4) | 1.0/0.5 | 0 | 2.0 |
| THIS INVENTION (FIG. 6) | 1.5/0.5 | +0.2 | 1.8 |

It is assumed here that the N$^+$ diffusion layers forming the subsidiary digit lines have a line/space ratio (hereafter abbreviated to L/S) of 0.5/0.5 (μm). The polysilicon conductors forming the word lines and the block selection lines have an L/S equal to 0.5/0.5 (μm). The aligning margin for the N$^+$ diffusion layers and the polysilicon conductors is equal to 0.05 μm. The table shows a channel width/channel length ratio (hereinafter abbreviated to W/L) of the block selection MOS transistors, an increase in size per one unit, and an increase in N$^+$ diffusion layer coupling capacity applied to the primary digit line per one unit in the above-mentioned conditions. For example, a single unit in the conventional device includes 32 word lines with the margin of 0.5 μm for the block selection line and the contact. The contact size is equal to 1.5 μm. In this event, the size per one unit in the conventional device is calculated as follows:

In the digit line direction:

0.5×36+0.5×35+0.5×2+1.5=38 (μm)

In the word line direction:

0.5×4+0.5×4=4 (μm)

In this invention, the increase in the digit line direction is as small as 0.53% and is negligible.

In the NOR-type mask ROM, when an on-bit memory cell is selected, a current path is formed as follows: the sense amplifier—the block selection MOS transistor—the memory cell (transistor)—the block selection MOS transistor—the ground GND. Herein, the current drivability of the block selection MOS transistor and the memory cell in the conventional device is replaced by a resistance R. A cell current in the conventional device is represented by Ion. In this event, the cell current in the publication device is given by:

$$Ion \times 3R/(0.5R+R+0.5R)=1.5 Ion.$$

On the other hand, the cell current in this invention is given by:

$$Ion \times 3R/(0.33R+R+0.33R)=1.8 Ion.$$

Thus, an increase of 30% is expected according to this invention, which is effective when the multilevel cell is used.

A charge time of the digit line is given by:

$$\Delta t = C \cdot \Delta V/I.$$

If the charge time in the conventional device represented by 1, the charge time is 0.67 in the publication device. According to this invention, the charge time can be reduced down to 0.56. This is effective in case of a low supply voltage which requires a long charge time.

As compared with the conventional device, it is possible according to this invention to widen the channel width of the block selection MOS transistor and to improve the current drivability while suppressing the chip size and the capacity applied to the primary digit line. Thus, the semiconductor device adapted to a high-speed operation, a low supply voltage, and the use of a multilevel cell with a plurality of threshold values can be realized.

What is claimed is:

1. A semiconductor device comprising a plurality of word lines arranged in a first direction in parallel to one another, first and second digit lines arranged in a second direction perpendicular to said first direction and perpendicularly intersecting with said word lines, a plurality of memory cell transistors with their sources and drains formed between said first and said second digit lines and with their gates connected to said word lines, respectively, first and second block selection lines arranged in said first direction, a first selection transistor formed between a first node and one end of said first digit line and having a gate connected to said first block selection line, and a second selection transistor formed between a second node and one end of said second digit line and having a gate connected to said second block selection line, at least one of said first and said second selection transistors being arranged so that a current flowing direction at a channel portion is coincident with said second direction and that the gate width is wider than the width of said first and said second digit lines.

2. A semiconductor device as claimed in claim 1, wherein, in at least one of said first and said second selection transistors, diffusion regions to serve as source and drain regions are formed in said first direction to be wider than the width of said first and said second digit lines.

3. A semiconductor device as claimed in claim 1, wherein said first and said second nodes are arranged at opposite sides with said memory transistors interposed therebetween, said first node being connected to a sense amplifier, said second node being connected to a power supply terminal.

4. A semiconductor device comprising a plurality of word lines arranged in parallel to one another in a first direction, first through fourth digit lines arranged in a second direction perpendicular to said first direction and perpendicularly intersecting with said word lines, a plurality of memory cell transistors with their sources and drains formed between said first and said second digit lines, between said second and said third digit lines, and between said third and said fourth digit lines and with their gates connected to said word lines, respectively, first through fourth block selection lines arranged in said first direction, a first selection transistor formed between a first node and one end of said first digit line and having a gate connected to said first block selection line a second selection transistor formed between said first node and one end of said third digit line and having a gate connected to said second block selection line, a third selection transistor formed between a second node and one end of said second digit line and having a gate connected to said third block selection line, and a fourth selection transistor formed between said second node and one end of said fourth digit line and having a gate connected to said fourth block selection line, said first through said fourth selection transistors being arranged so that a current flowing direction at a channel portion is coincident with said second direction and that the gate width is wider than the width of said first through said fourth digit lines.

5. A semiconductor device as claimed in claim 4, wherein diffusion regions to serve as source and drain regions of said first through said fourth selection transistors are formed in said first direction to be wider than the width of said first through said fourth digit lines.

6. A semiconductor memory device comprising a plurality of units each of which includes:

a plurality of word lines arranged in parallel to one another;

first and second block selection lines formed in parallel to said word lines at one side of said word lines;

third and fourth block selection lines formed in parallel to said word lines at the other side of said word lines;

first and second primary digit lines perpendicular to said word lines;

first through fourth subsidiary digit lines perpendicular to said word lines;

a plurality of memory cells with their drains and sources connected to adjacent ones of intersecting positions between said word lines and said first through said fourth subsidiary digit lines and with their gates connected to said word lines;

a first block selection MOS transistor with its source and drain connected to said first primary digit line and said first subsidiary digit line so that a channel path at a channel portion has a direction perpendicular to said first block selection line and with its gate located directly under said first block selection line and connected to said first block selection line;

a second block selection MOS transistor with its source and drain connected to said first primary digit line and said third subsidiary digit line so that a current path at a channel portion has a direction perpendicular to said second block selection line and with its gate located directly under said second block selection line and connected to said second block selection line;

a third block selection MOS transistor with its source and drain connected to said second primary digit line and said second subsidiary digit line so that a current path at a channel portion has a direction perpendicular to said third block selection line and with its gate located directly under said third block selection line and connected to said third block selection line; and a fourth block selection MOS transistor with its source and drain connected to said second primary digit line and said fourth subsidiary digit line so that a current path at a channel portion has a direction perpendicular to said fourth block selection line and with its gate located directly under said fourth block selection line and connected to said fourth block selection line;

the gate width of said first through said fourth block selection MOS transistors being greater than the length of said first through said fourth subsidiary digit lines in the direction of said word lines.

7. A semiconductor memory device as claimed in claim 6, wherein, in at least one of a combination of said first and said second block selection MOS transistors and a combination of said third and said fourth block selection MOS transistors, diffusion regions connected to said primary digit lines are linked in a stepwise fashion.

8. A semiconductor memory device as claimed in claim 6, wherein each of said memory cells comprises a transistor which is given any one of four or more threshold levels.

* * * * *